United States Patent [19]

Feuerbaum et al.

[11] Patent Number: 4,539,477
[45] Date of Patent: Sep. 3, 1985

[54] METHOD AND APPARATUS FOR SUPPRESSING DISTURBANCES IN THE MEASUREMENT OF SIGNALS WITH A PARTICLE PROBE

[75] Inventors: Hans-Peter Feuerbaum; Reinhold Schmitt, both of Munich, Fed. Rep. of Germany

[73] Assignee: Siemens Aktiengesellschaft, Berlin & Munich, Fed. Rep. of Germany

[21] Appl. No.: 499,484

[22] Filed: May 31, 1983

[30] Foreign Application Priority Data

Sep. 24, 1982 [DE] Fed. Rep. of Germany ....... 3235484

[51] Int. Cl.$^3$ .............................................. G01N 23/00
[52] U.S. Cl. .................................................... 250/310
[58] Field of Search ..................... 250/310; 324/158 D

[56] References Cited

U.S. PATENT DOCUMENTS 4,277,679 4/1981 Feuerbaum .......................... 250/310

OTHER PUBLICATIONS

Feuerbaum H. P., "VLSI Testing Using the Electron Probe", Scanning Electron Microscopy, 1979, I, pp. 285-295.

Primary Examiner—Bruce C. Anderson
Attorney, Agent, or Firm—Hill, Van Santen, Steadman & Simpson

[57] ABSTRACT

A method and apparatus suppress a disturbance in the measurement of signals with a particle probe by providing and measuring a known reference voltage on a specimen at at least one time and using the measurement for eliminating the drift phenomena appearing in a measured signal and enables a significant increase in the precision of the measurement of signals. A secondary electron signal which results from a measurement of a reference voltage controls the operating point of a feedback circuit for suppressing the disturbance.

15 Claims, 2 Drawing Figures

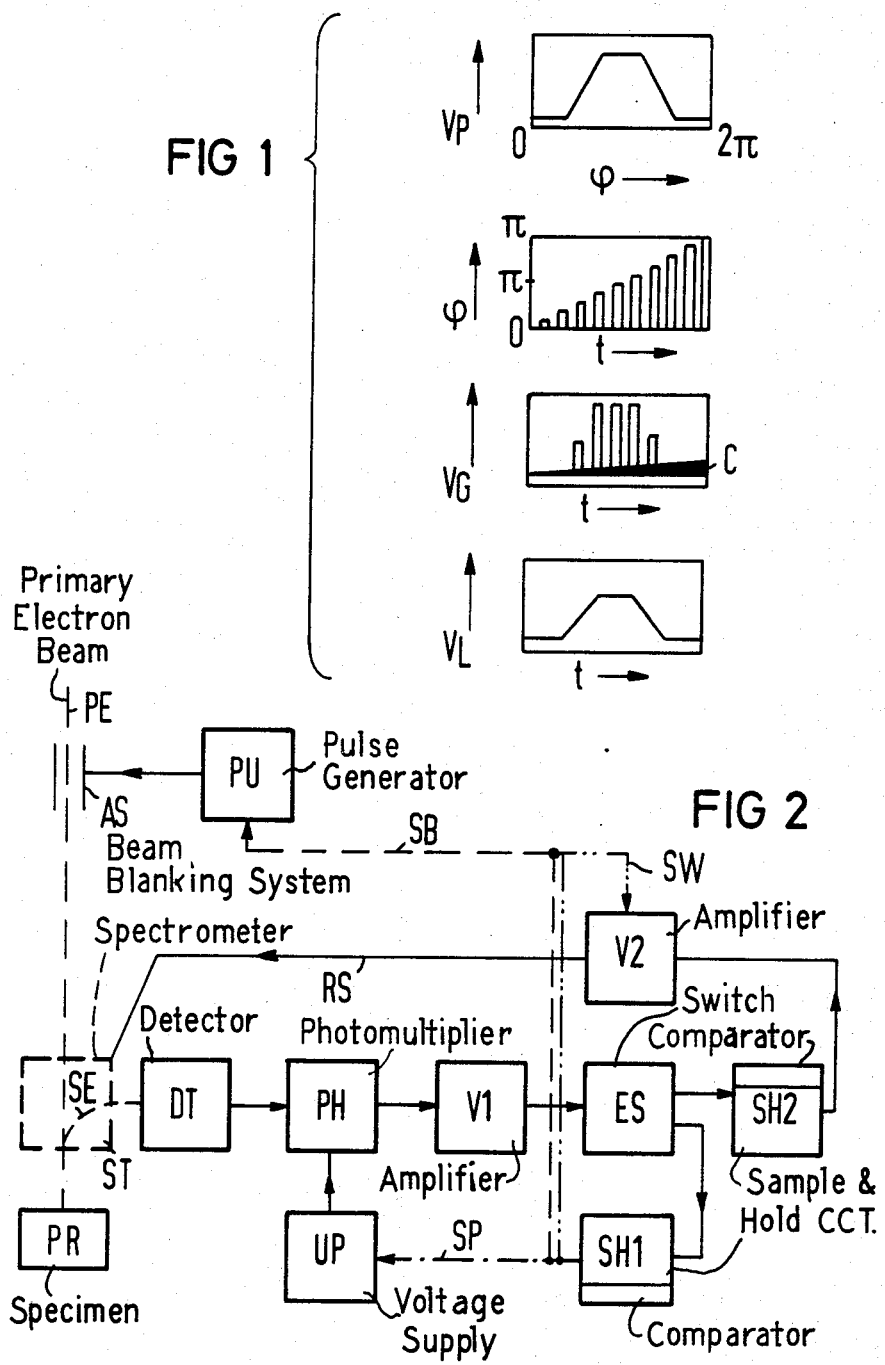

METHOD AND APPARATUS FOR SUPPRESSING DISTURBANCES IN THE MEASUREMENT OF SIGNALS WITH A PARTICLE PROBE

BACKGROUND OF THE INVENTION

1. Field of the Invention

The present invention relates to a method and apparatus for suppressing disturbances in the measurement of signals with a particle probe, in which a known reference voltage on a specimen is measured at at least one time.

2. Description of the Prior Art

When measuring signals with an electron probe, disturbances can occur due to contamination of the test subject and due to fluctuations of the beam current in the electron probe.

These disturbances could be nearly eliminated heretofore by a phase modulation method as discussed by H. P. Feuerbaum in the article "VLSI Testing Using The Electron Probe", Scanning Electron Microscopy, 1979, I, pp. 285–296, when such disturbances amount to only a few percent of the measured signal. The efficacy of this known method of phase modulation, however, no longer suffices. Such a known method of phase modulation, in particular, only eliminates the drift phenomena in a measured signal occurring as a result of disturbances. In general, such a measured signal not only drifts, but also becomes more inaccurate.

SUMMARY OF THE INVENTION

The object of the present invention is to provide a method and an apparatus of the type generally set forth above with which the drift phenomena occurring in a measured signal can be eliminated and the accuracy of the measurement of signals can also be significantly increased at the same time.

The above object is achieved, according to the invention, by a method which is characterized in that a secondary electron signal which results from a measurement of a reference voltage on the test specimen is employed to control the operating point of a feedback circuit for suppressing the disturbance.

BRIEF DESCRIPTION OF THE DRAWING

Other objects, features and advantages of the invention, its organization, construction and operation will be best understood from the following detailed description, taken in conjunction with the accompanying drawing, on which:

FIG. 1 illustrates the principle of phase modulation as employed in practicing the present invention; and FIG. 2 is a schematic representation of apparatus constructed and operating in accordance with the invention.

DESCRIPTION OF THE PREFERRED EMBODIMENTS

Referring to FIG. 1, the principle of phase modulation is illustrated. The method of the invention employs phase modulation for noise suppression in the measurement of signals with an electron probe PE (FIG. 2). This method of phase modulation is therefore explained in conjunction with the description of apparatus for carrying out the method according to FIG. 2. Apparatus for executing the method according to FIG. 2 comprises essentially a device as was described in the aforementioned publication by H. P. Feuerbaum or in U.S. Pat. No. 4,277,679, both fully incorporated herein by this reference.

In order to identify the potential at a measuring point in a specimen PR, for example, in an integrated circuit, the secondary electrons SE triggered by a primary electron beam PE are analyzed in terms of their energy in a spectrometer ST. Low-energy secondary electrons SE cannot overcome a retarding field generated within the spectrometer ST. Higher-energy secondary electrons SE are sensed by a detector DT. The energy distribution of the secondary electrons SE depends on the potential of the measuring point on the specimen PR. Given a change of this potential at the measuring point on the specimen PR, the energy distribution of the secondary electrons SE is essentially displaced on an energy scale. This shift of the energy distribution of the secondary electrons SE is identified with the aforementioned retarding field of the spectrometer ST. A feedback circuit RS is employed, the feedback circuit keeping the signal of the secondary electrons which can overcome the retarding field of the spectrometer ST constant. Changes of potential at the measuring point on the specimen PR therefore results in an identical voltage change at the retarding field electrode of the spectrometer ST (not illustrated in FIG. 2). The voltage at the retarding field electrode of the spectrometer ST therefore supplies the measured signal. The voltage at the retarding field electrode of the spectrometer ST is controlled by the feedback circuit RS. Disturbances influence the energy distribution of the secondary electrons SE triggered at the measuring point on the specimen PR. Over the feedback circuit RS, consequently, the voltage at the retarding field electrode is controlled such that the secondary electron measured signal perceived by the detector DT remains constant. Thus, however, the measurement of the potential at the measuring point on the specimen PR is falsified. This interrelationship is to be illustrated with reference to the example of contamination.

When a measuring point contaminates, then the secondary electron measured signal is decreased. As a consequence thereof, the voltage at the retarding field electrode of the spectrometer ST shifts in the positive direction. Given increasing contamination, therefore, more and more low-energy secondary electrons SE can overcome the retarding field of the spectrometer ST and can add to the secondary electron measured signal. These low-energy secondary electrons SE, however, basically deteriorate the measuring accuracy. When a measuring point is contaminated, the voltage applied to the retarding field electrode of the spectrometer ST from which the potential at the measuring point on the specimen PR to be measured is derived drifts, not only in a positive direction, but this voltage at the retarding field electrode and, therefore, the measured voltage as well, also becomes more inaccurate. Only the drift of the measured voltage, can be suppressed by phase modulation. Given this method of phase modulation, the signal of a constant reference phase, the signal likewise drifting, is also co-measured during the continuous scanning of a signal. The difference of measured signal and reference signal is free of drifts, but inaccurately reproduces changes of potential. Disturbances caused by contamination already deteriorate the measuring accuracy such that reproducible measurements in the mV range are hardly possible.

Given the method of phase modulation according to FIG. 1, the voltage at the measuring point on a specimen PR is switched back and forth between the potential to be measured and a reference voltage. It will be assumed that the reference voltage amounts to 0 volt. A period of a voltage $V_P$ to be measured is illustrated in the upper diagram of FIG. 1. When sampling the waveform of the voltage $V_P$, the phase $\phi$ of the primary electron probe PE is usually not continuously varied but, rather, discontinuously. The primary electron probe PE thus alternately strikes the surface of the specimen PR with a discontinuously-increased phase $\phi$, on the one hand, and then with a reference phase which is indicated in FIG. 1 with $\phi=0$. The system for processing the secondary electron measured signals measures the voltage $V_G$ during the discontinuously-increased phase and during the reference phase and thus supplies the difference of the voltages $V_G$ as the measured result. Due to the phase modulation of the primary electron probe PE, in particular, the voltage $V_G$ contains an a.c. voltage component. This a.c. voltage component can be detected with the assistance of a lock-in amplifier and can be integrated over a number of phases of the primary electron probe PE. The voltage $V_L$ which is uninfluenced by drift disturbances is obtained as the result of this technique.

This method of phase modulation can also be applied when only a d.c. voltage is to be measured at the measuring point on the specimen PR. For example, the voltage at the measuring point can then be alternately switched back and forth during the measurement between the d.c. voltage to be measured and 0 volt. Thereby, just as given the method according to FIG. 1, the additional drift voltage C occurring as a result of contamination can be identified and subtracted from the measured curve.

The method of the invention is based on the method of phase modulation. The secondary electron signal measured in the reference phase, however, is employed in this method to such end that the feedback circuit RS is balanced to a specific operating point. When the feedback circuit RS is thereby balanced to a prescribed operating point, then the retarding field in the spectrometer ST is always maintained constant despite the disturbances which influence the secondary electron measured signal. The secondary electrons triggered at the measuring point on the specimen PR in the reference phase which can overcome the retarding field of the spectrometer ST are identified by the detector DT. The secondary electrons SE sensed by the detector DT cause a secondary electron measured signal at the output of a photomultiplier PH connected to the detector DT, the measured signal being amplified in an amplifier V1 and then fed to an electronic switch ES. The secondary electron measured signal measured in the reference phase is then received in a sample and hold circuit SH1 and, in a comparator not illustrated on the drawing, can be compared to a reference value for the secondary electron measured signal, which is identified during the reference phase. Deviation from the reference value are amplified and, in an exemplary embodiment of the invention, control the amplification of a photomultiplier PH or the gain of a following amplifier V2, or control the pulse width of the primary electrons PE via a pulse generator PU and a beam blanking system AS such that the secondary electron measured signal which is measured in the reference phase corresponds to the reference value for the secondary electron measured signal measured during the reference phase. The control of the amplification of a photomultiplier PH thereby occurs such that the output of the sample and hold circuit SH1 drives the voltage supply UP of the photomultiplier PH such that the voltage of the photomultiplier PH assumes such a value that the secondary electron measured signal, measured during the reference phase, coincides with the reference value for the measured signal.

In another exemplary embodiment of the invention, a second sample and hold circuit SH2 is connected to a second output of the electronic switch ES, the output of the second sample and hold circuit SH2 again being connected to the amplifier V2 whose output is again directly connected to the retarding field electrode of the spectrometer ST, whereby the feedback loop RS is closed. When the voltage to be measured is available at the measuring point on the specimen PR, the secondary electron measured signal is relayed by the electronic switch ES to the sample and hold circuit SH2.

In another embodiment of the invention, the gain of, for example, the amplifier V2 can be controlled by way of the output of the sample and hold circuit SH1, as indicated by broken lines, such that the secondary electron measured signal, measured during a reference phase, coincides with the reference value of the measured signal.

Further exemplary embodiments of the invention are based on the fact that, given constant gain within the feedback loop RS, the reference value for the secondary electron measured signal is regulated. This regulation occurs such that the secondary electron measured signal, measured during a reference phase, is employed as a new reference value for that secondary electron measured signal which is employed for identifying a voltage to be measured at the measuring point on the specimen PR.

According to the method of the invention, the feedback circuit RS holds the barrier in the spectrometer ST constant independently of disturbances. Therewith, the secondary electron measured signal, measured in other phases which are not reference phases, is free of disturbances. The subtraction of the measured signal from the reference signal standard in phase modulation can basically be eliminated in view of the method of the present invention. Since a standard subtraction, however, separates the measured signal from the background, it should nonetheless be carried out.

The bandwidth available in practicing the present method for suppressing disturbances can be estimated at approximately 10 kHz. Therewith, disruptions due to beam current fluctuations such as occur given field emission cathods can also be suppressed without an operation on the electron optics being required.

Basically, the method of the invention which controls the gain or the reference value is superior to the method which controls the pulse width of the primary electrons PE because, given variation of the pulse width of the primary electrons PE, the chronological resolution of the arrangement also alters. When measuring very fast rising edges, this can lead to step-like signal progressions, i.e. a method of the invention which varies the pulse width of the primary electrons PE can only correct small disruptions given fast signal changes in comparison to other methods of the invention.

The method which controls the photomultiplier amplification requires the line SP, shown in dot-dash lines. The method which controls the gain of the amplifier V2 requires a control line SW, illustrated with a dot-dash line having two dots per dash. The method which controls the pulse width of the primary electrons PE requires a control line SB, shown by a broken or dash line. The method which regulates the reference value can, for example, likewise utilize the control line SP and control the voltage of the photomultiplier.

In practicing the present invention, one obtains the following advantages:

The invention enables an automatic operating point adjustment given which the previous individual adjustment of the operating point is eliminated.

The invention enables a suppression of beam current fluctuations. Disturbances which exceed the signal by a multiple can be suppressed, particularly given control of the photomultiplier voltage. Therefore, use of field emission cathods should be possible in electron beam mensuration technology.

The invention enables a suppression of contamination influences. The shift of the operating point due to contamination is constantly compensated during a measurement. The measuring errors previously caused by drift are reduced by a number of magnitudes.

The operation of the electronic switch ES, the sample and hold circuit SH1 and the sample and hold circuit SH2 illustrated in FIG. 2 can also be basically met by a single sample and hold circuit and an electronic switch connected to the output of the sample and hold circuit, one output leading therefrom to the amplifier V2 and the other output leading therefrom to the junction of the various control lines SP, SB, SW.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A method of suppressing a disturbance in measuring signals with a particle probe in which a primary electron beam is directed onto test points of a specimen and the secondary electrons emitted from the specimen are detected and measured as representing signals at those test points, comprising the steps of:
   applying a known reference voltage to a reference test point on a specimen to produce a known test signal at the reference test point;
   directing a primary electron beam, at least one time, during a reference phase, to the reference test point causing secondary electron emission;
   generating a control field with a retarding field generator;
   detecting the secondary electrons through the control field and generating a measured secondary electron signal; and
   feeding back the measured secondary electron signal as a reference signal to the field generator to control the field intensity during measurement of unknown signals at other test points on the specimen during a measuring phase to compensate for operating point shifts due to electron beam fluctuations and specimen contamination and maintain a specific operating point.

2. The method of claim 1, wherein the step of feeding back the secondary electron reference signal is further defined as:
   applying the measured secondary electron signal to a device in a feedback circuit to set the operating point of the feedback circuit to a predetermined operating point.

3. The method of claim 1, wherein the step of detecting secondary electrons and generating a measured secondary electron signal is performed with a scintillator detector followed by a photomultiplier, and further comprising the steps of:
   sensing whether the measured secondary electron voltage deviates from a predetermined value; and
   altering the supply voltage of the photomultiplier upon sensing such deviations.

4. The method of claim 1, wherein the feedback circuit comprises an amplifier, and further comprising the steps of:
   sensing whether the measured secondary electron signal deviates from a predetermined value; and
   adjusting the gain of the amplifier upon sensing such deviations.

5. The method of claim 1, wherein the primary electron beam is controlled by a pulsing system, and further comprising the steps of:
   sensing whether the measured secondary electron signal deviates from a predetermined value; and
   adjusting the pulsing system to adjust the pulse width in response to such deviations until such deviations disappear.

6. The method of claim 1, and further comprising the step of:
   regulating a reference value for the secondary electron signal with the measured secondary electron signal.

7. The method of claim 1, and further comprising the step of:
   subtracting the measured secondary electron signal from a reference value to suppress background noise.

8. Apparatus for suppressing a disturbance in measuring signals, in which a primary electron beam is directed onto test points of a specimen and secondary electrons are emitted from the specimen and measured as representing signals at those test points, said apparatus comprising:
   means for applying a known reference voltage to a reference test point to produce a known test signal at the reference test point;
   beam control means operable to direct a primary electron beam onto the reference test point, at least one time during a reference phase, to cause secondary electron emission;
   retarding field generator means adjacent the specimen operable to produce a control field;
   detection means adjacent said retarding field generator means for detecting secondary electrons which permeate the control field, including detecting means and generator means for generating a respective measured secondary electron signal; and
   feedback means connected between said detection means and said retarding field generator for applying the measured secondary electron signal as a reference signal to control field intensity during measurement of unknown signals at other test points on the specimen during a measuring phase to compensate for operating point shifts due to electron beam fluctuations and specimen contamination and maintain a specific operating point.

9. The apparatus of claim 8, wherein:
said detection means comprises a scintillator detector, a photomultiplier connected to said scintillator detector and an amplifier connected between said photomultiplier and said feedback means.

10. The apparatus of claim 9, wherein:
said beam control means comprises a beam blanking system and a pulse generator connected to and operable to control said beam blanking system to provide a pulsed primary electron beam; and further comprising
control means connected between said amplifier and said pulse generator, including comparison means for comparing the measured secondary electron signal with a reference for deviations therebetween, and operable to control said pulse generator to change the pulse width of said primary electron beam until such deviations disappear.

11. The apparatus of claim 10, wherein said control means comprises:
a sample and hold circuit connected between said amplifier and said pulse generator for sampling and temporarily storing the measured secondary electron signal.

12. The apparatus of claim 9, and further comprising:
a voltage supply connected to said photomultiplier; and
control means connected between said amplifier and said voltage supply, including comparison means for comparing the measured secondary electron signal with a reference for deviations therebetween, and operable to adjust the voltage supplied to said photomultiplier in response to such deviations.

13. The apparatus of claim 12, wherein said control means comprises:
a sample and hold circuit for sampling and temporarily storing the measured secondary electron signal.

14. The apparatus of claim 9, wherein said feedback circuit comprises:
a further amplifier connected between said detection means and said field generator.

15. The apparatus of claim 14, and further comprising:
a sample and hold circuit connected between said amplifier and said further amplifier, including comparison means for comparing the measured secondary electron signal with respect to a reference value to determine deviations therebetween; and
control means connected to said detection means for controlling the gain of said further amplifier.

* * * * *